United States Patent [19]

Kullander et al.

[11] Patent Number: 5,543,210
[45] Date of Patent: Aug. 6, 1996

[54] DIAMOND COATED BODY

[75] Inventors: Gregor Kullander, Älvsjö; Ingrid Reineck, Huddinge; Heléne Brandrup-Wognsen, Ingarö, all of Sweden

[73] Assignee: Sandvik AB, Sandviken, Sweden

[21] Appl. No.: 264,937

[22] Filed: Jun. 24, 1994

[30] Foreign Application Priority Data

Jul. 9, 1993 [SE] Sweden ................... 9302405

[51] Int. Cl.$^6$ ................... B24D 11/00
[52] U.S. Cl. ................... 428/217; 428/131; 428/212; 428/216; 428/336; 428/408; 428/698; 51/295; 51/307; 51/309; 407/119
[58] Field of Search ................... 428/217, 698, 428/408, 336, 216, 131, 212; 51/295, 307, 309; 407/119

[56] References Cited

U.S. PATENT DOCUMENTS

| | | | |
|---|---|---|---|
| 4,403,015 | 9/1983 | Nakai et al. | 428/698 |
| 4,411,672 | 10/1983 | Ishizuka et al. | 51/309 |
| 4,605,343 | 8/1986 | Hibbs, Jr. et al. | 407/119 |
| 4,686,080 | 8/1987 | Hara et al. | 419/8 |
| 4,731,303 | 3/1988 | Hirano et al. | 428/698 |
| 4,734,339 | 3/1988 | Schachner et al. | 428/701 |
| 4,743,515 | 5/1988 | Fischer et al. | 428/698 |
| 4,820,482 | 4/1989 | Fischer et al. | 419/15 |
| 4,931,363 | 6/1990 | Slutz et al. | 428/408 |
| 5,037,704 | 8/1991 | Nakai et al. | 428/408 |
| 5,090,969 | 2/1992 | Oki et al. | 51/295 |
| 5,126,207 | 6/1992 | Chen et al. | 428/408 |

FOREIGN PATENT DOCUMENTS

| | | |
|---|---|---|
| 59-166671 | 9/1984 | Japan . |
| 59-166672 | 9/1984 | Japan . |
| 80/02817 | 12/1980 | WIPO . |

OTHER PUBLICATIONS

Chattopadhyay et al, "On Surface Modification of Superabrasive Grits by CVD of Chromium", *Annals of the CIRP*, vol. 41/1/1992, pp. 381–385.

*Primary Examiner*—A. A. Turner
*Attorney, Agent, or Firm*—Burns, Doane, Swecker & Mathis

[57] ABSTRACT

There is now provided a body of cemented carbide, $Si_3N_4$ or another ceramic material, coated by at least one CVD or PVD diamond or cBN layer with a chromium nitride, chromium carbide or chromium carbonitride layer. The chromium-containing layer is outside the diamond layer which in the case of more than one diamond layer is the outermost diamond layer of the coating. Improved machining properties are obtained.

16 Claims, 1 Drawing Sheet

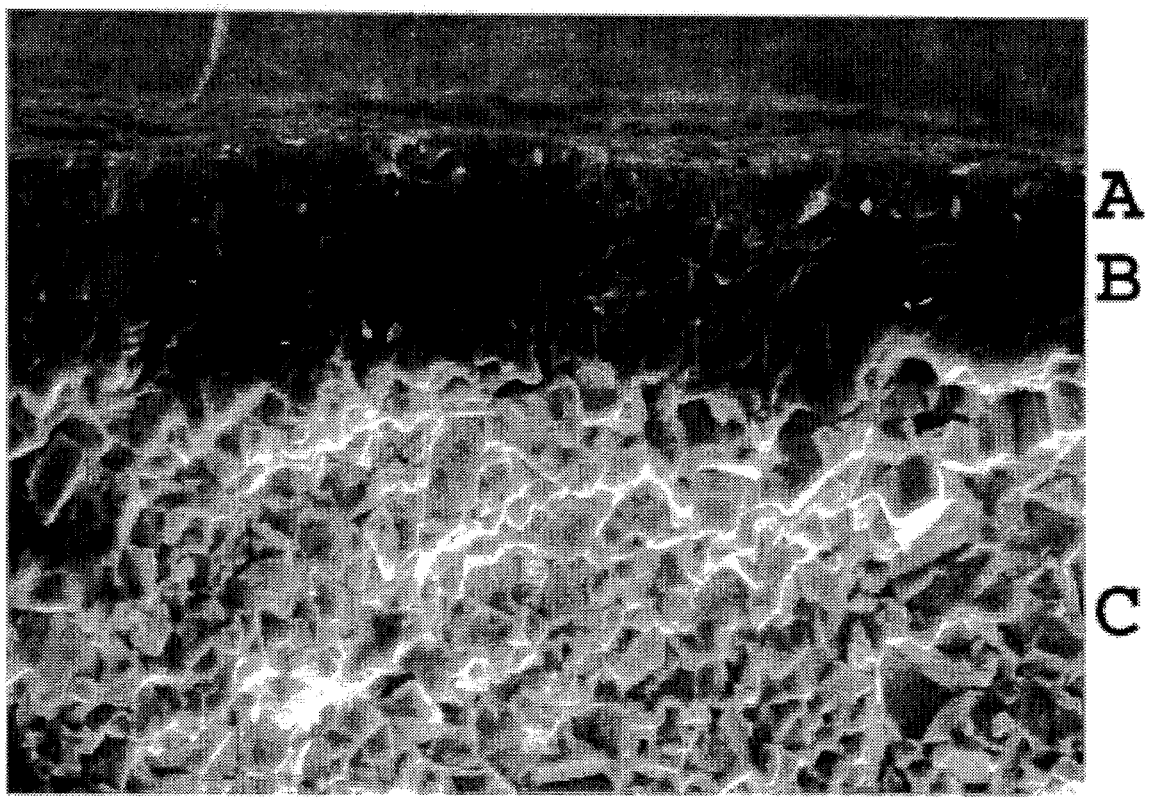

DIAMOND COATED BODY

BACKGROUND OF THE INVENTION

The present invention relates to a diamond coated body with a well adherent and wear resistant diamond coating, particularly a cutting tool aimed for cutting Al-alloys containing, e.g., Si and Cu as alloying elements and the like.

The production of thin coatings of diamond directly from the gas phase by CVD or PVD technique is of great interest for coating of cutting tools, drill bits, knives, etc. Gas phase deposition of diamond at useful deposition rates was reported in 1977 by Russian investigators. When the results were reproduced by a group of Japanese scientists in the early eighties, an intensive research in CVD diamond started all over the world. A series of new methods for diamond coating from gas phase has been described, including hot filament, microwave plasma, arc discharge plasma, gas flame, hollow cathode, and different forms of plasma jets. Usually pure hydrogen with the addition of 0.1 to 5.0% $CH_4$ is used as the gas mixture, but also other hydrocarbon gases can be used as the carbon source. In addition, the purity and quality of the diamond film can be controlled by adding other gases, for example oxygen containing and noble gases.

The main problem in applying CVD diamond coatings on cutting tool inserts (also referred to as substrates) for machining operations has turned out to be an insufficient adhesion of the diamond coating. The adhesion is strongly influenced by the surface characteristics of the insert. The main reason, however, for poor adhesion is believed to be the formation of voids and non-diamond carbon material at the coating/substrate interface in combination with high compressive stresses in the coating. The formation of high residual (compressive) stresses is partly due to the low coefficient of thermal expansion of diamond.

The substrates of interest for diamond coatings in cutting tool applications include cemented carbides and ceramics such as SiAlON and $Si_3N_4$ and the deposition of diamond on these categories of substrates is well known in the art. However, as mentioned above, these prior art products suffer from an insufficient adhesion of the diamond coating as judged from machining tests. A suggested remedy for the poor adhesion is to apply an intermediate coating with properties that better adapt to the diamond than to the original substrate material. In JP-A-59-166671 and JP-A-59-166672, a method is described of coating cemented carbide or metal alloys with diamond and, before that, an inner intermediate coating of various carbides, nitrides, carbonitrides or oxycarbonitrides of the transition metals of the groups IV, V or VI of the Periodic Table, or of silicon, boron or aluminum. The possibility of having any of these types of coatings as the outermost layer is also mentioned. The coatings are deposited by magnetron sputtering. The tools are said to be excellent in wear resistance, however, the presence of an outermost coating (other than diamond) is not said to influence the wear resistance in the same manner as an intermediate coating does.

Another example where an intermediate coating is said to improve the adhesion between the diamond coating and the substrate is U.S. Pat. No. 4,734,339 (our reference: 024000-317). This patent describes a compound body which has a thin coating of metals with high affinity to carbon, certain carbides, nitrides and oxides or a noble metal between the diamond coating and the substrate. Again the possibility of having any of these coatings as the outermost is mentioned but not as being particularly favorable.

In Chattopadhyay et al, "On Surface Modification of Superabrasive Grits by CVD of Chromium", *Annals of the CIRP*, vol. 41/1/1992, pages 381–385, a method is described where diamond particles are coated with functioning layer of chromium or chromium carbide. In this paper, however, the adhesion between the chromium coated diamond particles and a surrounding matrix into which the particles are mixed, is in focus.

OBJECTS AND SUMMARY OF THE INVENTION

It is an object of this invention to avoid or alleviate the problems of the prior art.

It is further an object of this invention to provide a well adherent and wear resistant diamond coating.

In one aspect of the invention there is provided a body coated with at least one diamond layer and atop said diamond layer, at least one layer of chromium carbide, chromium nitride or chromium carbonitride.

In another aspect of the invention there is provided a method of making a diamond coated body in which a layer of diamond is coated atop a body, the improvement wherein at least one layer of chromium carbide, chromium nitride or chromium carbonitride is deposited on the diamond layer.

BRIEF DESCRIPTION OF THE DRAWING

The Figure is a Scanning Electron Micrograph in 4000X of a coating according to the present invention in which A—CrN-layer
B—diamond layer
C—cemented carbide body

DETAILED DESCRIPTION OF THE PREFERRED EMBODIMENTS OF THE INVENTION

It has now surprisingly been found that the flaking resistance as well as the wear resistance of a diamond coating on a cemented carbide or ceramic body, in particular a cutting tool insert, can be considerably enhanced if a thin coating of chromium nitride, chromium carbide or chromium carbonitride is deposited on top of the diamond coating. Even though the chromium-containing layer is easily removed locally during the cutting operation, the presence of the layer typically results in an increased performance of at least 50% measured as the number of components machined or as the time until the coating wears through. The beneficial effect is further increased if the coating is subjected to mechanical post treatment such as blasting or brushing with hard particles. Typically, by the combined treatment consisting of the deposition of a chromium-containing layer and the mechanical post treatment, a two-fold increase in performance is obtained.

According to the present invention, there is now provided a body with a coating of at least one diamond layer and at least one layer of chromium nitride, chromium carbide or chromium carbonitride, preferably chromium nitride, outside the diamond layer. In case of more than one diamond layer, this diamond layer is the outermost diamond layer of the coating. Preferably, the chromium-containing layer is in direct contact with the diamond layer but there may also be, between the chromium-containing layer and the diamond layer, a thin, <1 µm thick layer comprising a wear resistant or metallic material.

Generally the chromium-containing layer is the outermost but there may also be on top of that layer an additional, 0.1–3 μm thick, layer comprising another wear resistant, metallic or coloring layer as known in the art.

In a preferred embodiment, the diamond layer is in direct contact with the coated body or separated therefrom by a <3 μm thick layer of a conventional wear resistant or metallic material.

The thickness of diamond layer is in the range 1–20 μm, preferably 4–15 μm and the thickness of the Cr-containing layer is 0.1–5 μm. The thickness of the latter layer is always <200%, preferably <50%, of the thickness of the diamond layer.

The grain size of the diamond coating is preferably <15 μm, most preferably 3–10 μm. The grain size of the Cr-containing layer is <1 μm.

The chromium-containing layer has (or is treated to have) a surface roughness $R_a$ 0.1–0.5 μm, preferably 0.2–0.3 μm.

The bodies used for deposition according to the present invention include cemented carbides and ceramics such as SiAlON and $Si_3N_4$. Preferably, a cemented carbide body is depleted in the surface zone with respect to Co. This can, for example, be obtained by partly carburizing an eta-phase-containing body as disclosed in EP 464 012 which corresponds to U.S. Ser. No. 08/214,157 (our reference 024000-807).

According to the present invention, there is also provided a method of making diamond coated bodies with improved adhesion. The bodies are first coated with at least one diamond layer using any known diamond CVD or PVD deposition technique, for example methods using a hot filament, DC, RF and MW plasmas, hollow cathode or a plasma jet. In these methods, hydrocarbons and hydrogen are used in different mixture ratios and at low pressures (1–1000 mbar) for the diamond formation. In some methods, the diamond deposition may result in a layer only partly covering the body. Outside the (outermost) diamond layer, preferably on top of it, at least one layer of chromium carbide, chromium nitride or chromium carbonitride is deposited. The Cr-containing layer can be applied by any known CVD or PVD method that does not negatively affect the diamond coating, preferably, PVD technique and most preferably ion plating.

Preferably, the body is after coating subjected to a mechanical post treatment in order to smoothen the surface. One example of such mechanical treatment is a slight wet blasting with hard particles, e.g., $Al_2O_3$, SiC, WC or diamond with mesh sizes typically 100–400. Another example is a slight brushing with SiC brushes using diamond or SiC powder (typically 100–300 mesh) as a brushing agent. Preferably, the outermost layer is partly removed with a coverage in the edge of 25–75%.

An explanation for the improved performance of the machining properties of a diamond coated cutting tool according to the present invention may be the reduction of cutting forces during the machining operation considering the fact that the chromium-containing layer is considerably smoother than a pure CVD diamond coating. The chip removal may be facilitated as the chips are in contact with the smooth, chromium-containing layer.

The invention has been described with reference to diamond coated cutting tools but the invention may also be applied to other coated tools, e.g., tools for rock drilling and wear parts as well as to other superhard coatings such as cBN coatings deposited by CVD or PVD methods.

The invention is additionally illustrated in connection with the following Examples which are to be considered as illustrative of the present invention. It should be understood, however, that the invention is not limited to the specific details of the Examples.

EXAMPLE 1

Six WC-6%Co cemented carbide inserts with a Co depleted surface zone, were first coated with a 10 μm thick diamond layer using microwave assisted plasma CVD. The grain size of the layer was about 10 μm. Onto the diamond layer, a second layer consisting of 2 μm CrN was deposited in a reactive ion plating process.

A smooth CrN layer was obtained with surface roughness $R_a$=0.25 μm.

The inserts were subjected to a milling flaking test in an Al-9% Si alloy using the following cutting data:

v=1000 m/min f=0.3 mm/tooth a=1 mm wet cutting

The diamond/CrN coated set of inserts lasted 320 passes in this test compared to a set of inserts with diamond coatings only which lasted 170 passes.

EXAMPLE 2

Six $Si_3N_4$ inserts were coated with a 10 μm thick diamond layer as in Example 1. A 4 μm CrN layer was deposited on top of the diamond layer as in Example 1. A smooth CrN layer was obtained with surface roughness $R_a$=0.25 μm.

The inserts were subjected to a milling flaking test in an Al-4%-Cu-0.3 % Si alloy using the following cutting data:

v=1000 m/min f=0.3 mm/tooth a=1 mm wet cutting

The diamond/CrN coated set of inserts lasted 150 passes in this test compared to a set of inserts with diamond coatings only which lasted 70 passes.

EXAMPLE 3

A WC-6% Co cemented carbide insert with a Co depleted surface zone was first coated with a 5 μm thick diamond layer using microwave assisted plasma CVD similar to Example 1 but shorter deposition time. The grain size of the layer was about 7 μm. Onto the diamond a second layer consisting of 1 μm CrN was deposited in a reactive ion plating reactor. On top of the CrN coating a 2 μm TiN layer was applied using ion plating A surface roughness of $R_a$=0.23 μm of the tool surface was obtained.

The insert was subjected to a turning test in an Al-18%Si alloy using the cutting data:

v=700 m/min f=0.1 mm a=0.6 mm wet cutting

The diamond/CrN/TiN coated insert lasted 44 minutes before coating break through while an insert with a 5 μm thick diamond coating only lasted 16 minutes (when the coating flaked off).

EXAMPLE 4

A WC-6% Co cemented carbide insert with a Co depleted surface zone was coated with a 10 µm diamond layer by using a hot filament reactor. Onto the diamond a second layer consisting of 2 µm CrN was deposited as in Example 1. The insert was then subjected to wet blasting using 200 mesh $Al_2O_3$.

A smooth, well-adherent CrN layer was obtained (i.e., no spontaneous flaking was observed). The surface roughness was $R_a=0.2$ µm. The CrN was removed spotwise in the edge line but still adhered well on the other parts of the insert.

The insert was subjected to a turning test in an Al-18%Si alloy using the cutting data:

v=700 m/min
f=0.1 mm
a=0.6mm
wet cutting

The diamond/CrN coated and blasted insert lasted 240 minutes before coating break through while a diamond/CrN coated insert without blasting lasted 180 minutes and an insert with a 10 µm thick diamond coating only lasted 50 minutes.

EXAMPLE 5

A WC-4% Co cemented carbide insert with a Co depleted surface zone was coated with a diamond layer as in Example 1. Onto the diamond, a second layer consisting of 2 µm CrN was deposited using PVD ion sputtering. The insert was then subjected to brushing with SiC brushes using 150 mesh diamond powder as a brushing agent.

A smooth, well-adherent CrN layer was obtained. The surface roughness was $R_a=0.2$ µm. The CrN was removed spotwise in the edge line but still adhered well on the other parts of the insert.

The insert was subjected to a turning test in an Al-18%Si alloy using the cutting data:

v=700 m/min
f=0.1 mm
a=0.6mm
wet cutting

The diamond/CrN coated and brushed insert lasted 200 minutes before coating break through while an insert with a 10 µm thick diamond coating only lasted 50 minutes.

EXAMPLE 6

A 5 µm thick diamond layer was deposited on a WC-6%Co cemented carbide insert with a Co depleted surface zone. The diamond was additionally coated with a 1 µm thick CrN layer. The insert was then wet blasted using 200 mesh $Al_2O_3$ blasting particles. The insert was subjected to turning of components in an Al-7% Si alloy at an end user's site using the cutting dam:

v=1500 m/min
f=0.8 mm
a=1–3 mm
dry cutting

The diamond/CrN coated insert was used for machining 164 components while an insert with a 5 µm thick diamond coating was used only for 99 components. The failure mechanism was flaking of the coatings.

EXAMPLE 7

A 10 µm thick diamond layer was deposited on a WC-6%Co cemented carbide insert with a Co depleted surface zone. The diamond was subsequently coated with a 2 µm thick CrN layer.

The insert was subjected to a turning test in an Al-7%Si alloy at an end user's site using the following cutting dam:

v=2500 m/min
f=0.25 mm
a=0.5 mm
dry cutting

The diamond/CrN coated insert was used for machining 136 components while an insert with a 10 µm thick diamond coating was used for only 88 components. The failure mechanism was flaking of the coatings.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A body coated with at least one diamond layer and atop said diamond layer, at least one layer of chromium carbide, chromium nitride or chromium carbonitride, wherein the chromium carbide, chromium nitride or chromium carbonitride layer is a outermost layer having an exposed surface.

2. The body according to claim 1 wherein the diamond layer is in direct contact with said body.

3. The body according to claim 1 wherein there is a <3 µm thick layer of a wear resistant or metallic material between said body and said diamond layer.

4. The body according to claim 1 wherein said layer of chromium carbide, chromium nitride or chromium carbonitride is in direct contact with said diamond layer.

5. The body according to claim 1 wherein there is a <1 µm thick wear resistant or metallic layer between the body and the layer of chromium carbide, chromium nitride or chromium carbonitride.

6. The body according to claim 1 wherein the coated body is provided with a 0.1–3 µm thick layer of another wear resistant, metallic or coloring layer atop said layer of chromium carbide, chromium nitride or chromium carbonitride.

7. The body according to claim 1 wherein the layer of chromium carbide, chromium nitride or chromium carbonitride has a surface roughness of $R_a$ 0.1–0.5 µm.

8. The body according to claim 7 wherein the layer of chromium carbide, chromium nitride or chromium carbonitride has a surface roughness of $R_a$ 0.2–0.3 µm.

9. The body according to claim 1 wherein the thickness of said diamond layer is 2–15 µm and the thickness of the layer of chromium carbide, chromium nitride or chromium carbonitride is 0.2–5 µm.

10. The body according to claim 1 wherein said body is a cemented carbide with a Co-depleted surface zone.

11. The body according to claim 1 wherein the layer is chromium nitride.

12. The body according to claim 1 wherein the at least one diamond layer comprises first and second diamond layers and the at least one layer of chromium carbide, chromium nitride or chromium carbonitride comprises first and second layers of chromium carbide, chromium nitride or chromium carbonitride, the first layer of chromium carbide, chromium nitride or chromium carbonitride being between the first and second diamond layers and the second layer of chromium carbide, chromium nitride or chromium carbonitride being atop the second diamond layer.

13. The body according to claim 1 wherein the at least one chromium carbide, chromium nitride or chromium carbonitride layer consists essentially of chromium carbide, chromium nitride or chromium carbonitride.

14. The body according to claim 1 wherein the at least one chromium carbide, chromium nitride or chromium carbonitride layer consists essentially of chromium carbide.

15. The body according to claim 1 wherein the at least one chromium carbide, chromium nitride or chromium carbonitride layer consists essentially of chromium carbonitride.

16. The body according to claim 1 wherein a layer comprising a wear resistant or metallic material is between the at least one diamond layer and the at least one layer of chromium carbide, chromium nitride, or chromium carbonitride.

* * * * *